US 6,784,707 B2

(12) United States Patent
Kim et al.

(10) Patent No.: US 6,784,707 B2
(45) Date of Patent: Aug. 31, 2004

(54) DELAY LOCKED LOOP CLOCK GENERATOR

(75) Inventors: Chulwoo Kim, Austin, TX (US); Sung-Mo Kang, Santa Cruz, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 10/192,734

(22) Filed: Jul. 10, 2002

(65) Prior Publication Data

US 2004/0008063 A1 Jan. 15, 2004

(51) Int. Cl.[7] ................................................. H03L 7/06
(52) U.S. Cl. ..................................... 327/158; 327/142
(58) Field of Search ................................ 327/113, 116, 327/119, 122, 142, 149, 152, 153, 158, 161; 377/47, 48

(56) References Cited

U.S. PATENT DOCUMENTS

| | | | | |
|---|---|---|---|---|
| 5,179,303 A | * | 1/1993 | Searles et al. ............... | 327/277 |
| 5,786,715 A | * | 7/1998 | Halepete ...................... | 327/116 |
| 5,977,801 A | * | 11/1999 | Boerstler ....................... | 327/7 |
| 6,100,736 A | * | 8/2000 | Wu et al. ..................... | 327/159 |
| 6,147,525 A | * | 11/2000 | Mitani et al. ................ | 327/119 |
| 6,150,855 A | * | 11/2000 | Marbot ......................... | 327/116 |
| 6,295,328 B1 | * | 9/2001 | Kim et al. ................... | 375/376 |
| 6,316,987 B1 | | 11/2001 | Dally et al. .................. | 327/538 |
| 6,342,797 B1 | | 1/2002 | Lee .............................. | 327/156 |
| 6,492,919 B2 | * | 12/2002 | Guinea et al. ................ | 341/73 |

FOREIGN PATENT DOCUMENTS

WO     WO 97/40576    * 10/1997      ........... H03B/19/00

OTHER PUBLICATIONS

K. Kurita, T. Hotta, T. Nakano, and N. Kitamura, "PLL–Based BiCMOS On–Chip Clock Generator for Very High–Speed Microprocessor," IEEE J. Solid–State Circuits, vol. 26, No. 4, pp. 585–589, Apr. 1991.

I.A. Young, J.K. Greason, and K.L. Wong, "A PLL Clock Generator With 5 to 110 MHz of Lock Range for Microprocessors," IEEE J. Solid–State Circuits, vol. 27, No. 11, pp. 1599–1607, Nov. 1992.

J. Alvarez, H. Sanchez, G. Gerosa, and R. Countryman, "A Wide–Bandwidth Low–Voltage PLL for PowerPC™ Microprocessors," IEEE J. Solid–State Circuits, vol. 30, No. 4, pp 383–391, Apr. 1995.

V. von Kaenel, D. Aebischer, C. Piguet, and E. Dijkstra, "A 320 MHz, 1.5mW @ 1.35 V CMOS PLL for Microprocessor Clock Generation," IEEE J. Solid–State Circuits, vol. 31, No. 11, pp. 1715–1722, Nov. 1996.

V. R. von Kaenel, "A High–Speed, Low–Power Clock Generator for a Microprocessor Application," IEEE J. Solid–State Circuits, vol. 33, No. 11, pp. 1634–1639, Nov. 1998.

D. W. Boerstler, "A Low–Jitter PLL Clock Generator for Microprocessors with Lock Range of 340–612 MHz," IEEE J. Solid–State Circuits, vol. 34, No. 4, pp. 513–579, Apr. 1999.

(List continued on next page.)

Primary Examiner—Timothy P. Callahan
Assistant Examiner—Cassandra Cox
(74) Attorney, Agent, or Firm—Greer, Burns & Crain, Ltd.

(57) ABSTRACT

A delay locked loop (DLL) clock generator circuit is provided for generating a clock signal Clk according to a pair of input signals to the circuit. One of the input signals is a reference signal, and the second input signal is a feedback signal of a voltage controlled delay line circuit. The DLL circuit includes a phase detector that can be reset to expand the locking range for detecting a phase difference between the reference signal and the feedback signal. Based on the detected phase difference, the phase detector provides an output signal that is further processed by the DLL circuit to generate a number of delayed signals to a frequency multiplier. Using the delayed signals, the frequency multiplier generates a frequency multiplied clock signal having a frequency that is a multiple of the frequency of the reference signal.

23 Claims, 5 Drawing Sheets

OTHER PUBLICATIONS

G. Chien, P. Gray, "A 900–MHz Local Oscillator Using a DLL–Based Frequency Multiplier Technique for PCS Applications," IEEE J. Solid–State Circuits, vol. 35, No. 12, pp. 1996–1999, Dec. 2000.

D.J. Foley, M.P. Flynn, "CMOS DLL–Based 2–V 3.2 ps Jitter 1–GHz Clock Synthesizer and Temperature–Compensated Tunable Oscillator," IEEE J. Solid–State Circuits, vol., 36, No. 3, pp. 417–423, Mar. 2001.

C. Kim, I.–C. Hwang, S.–M. Kang, "Low–Power Small–Area ±7.28–ps Jitter 1–GHzDLL–Based Clock Generator", ISSCC 2002, Feb. 5, 2002.

C. Kim, I.–C. Hwang, and S.–M. Kang, "Low–Power Small–Area ±7.28–ps Jitter 1–GHz Clock Generator", pp. 1–18.

* cited by examiner

DELAY LOCKED LOOP CLOCK GENERATOR

FIELD OF THE INVENTION

The present invention relates to semiconductor electronic devices, and more particularly to clock generating circuits.

BACKGROUND OF THE INVENTION

Operation of a microprocessor, digital signal processor (DSP) and other integrated circuits, requires a system clock. Many clock generators in high-performance microprocessors employ a phase-locked loop (PLL) in their clock generation schemes to generate a clock signal. Generally, a PLL clock generator has a voltage-controlled oscillator (VCO), and a phase/frequency detector that receives an external reference input signal combined with a feedback input signal from the VCO. The PLL clock generator further includes a charge pump and a loop filter circuit connected in series between the phase/frequency detector and VCO. To generate the clock signal, a first divider circuit receives the VCO output and supplies the feedback input to the phase-frequency detector. A second divider circuit also receives the VCO output and generates the clock signal.

Another known clock generation scheme uses a delay locked loop (DLL). Generally, such systems have an external clock signal fed to a phase detector, a voltage controlled delay line (VCDL), and an input of an exclusive OR (XOR) gate that generates the frequency multiplied clock signal. In this clocking scheme, the phase detector outputs a signal to a loop filter which provides an output signal to the VCDL. The VCDL generates a first output that is fed to the XOR gate to generate a doubled frequency output.

PLL clock generators are known to have several disadvantages in comparison to DLL clock generators. First, a PLL clock generator is a higher-order circuit than a similar DLL clock generator circuit, and as such, is more difficult to design. Second, in a PLL clock generator the loop bandwidth critical for stable operation can change due to process, voltage and temperature variations. Moreover, the VCO output timing uncertainty or jitter accumulates over multiple oscillation cycles and is limited by the time response of the PLL clock generator. Furthermore, as new chip designs operate under increasingly noisy conditions and have delay variations due to power supply/substrate noises, existing PLL clock generators will not be able to provide instantaneous corrections to the delay variations.

DLL clock generators have several inherent advantages over PLL clock generators. DLL clock generators are first-order circuits which are more stable (i.e., have a stable loop operation), and are easily integrated with the loop filter. These advantages enable easier designs of DLL clock generators. Additionally, unlike PLL clock generators, DLL clock generators have no jitter accumulation. Moreover, DLL clock generators are fast locking. While DLL clock generators have advantages as compared to PLL clock generators, PLL generators are preferred for use in generating clock signals due to the difficulty of achieving frequency multiplication using a voltage-control delay line in DLL clock generators.

SUMMARY OF THE INVENTION

A delay locked loop (DLL) clock generator circuit is provided for multiplying a frequency of a reference signal inputted into the DLL circuit. The DLL circuit includes a phase detector that receives the reference signal and a feedback signal of the DLL circuit to compare a phase difference or delay between the reference and feedback signals. Based on the phase difference, the phase detector provides a control voltage which is processed by the DLL circuit to generate a control signal. Preferably, the phase detector is reset by presetting gate voltages of the phased detector prior to receiving the feedback and reference signals. Resetting enables the phase detector to have an expanded locking range between the feedback and reference signals. The control signal is delayed at various time intervals to generate a number of delayed signals inputted into a frequency multiplier of the DLL circuit. Using the delayed signals, the frequency multiplier generates an output clock signal that has a frequency that is a multiple of the frequency of the reference signal.

DETAILED DESCRIPTION OF THE PREFERRED EMBODIMENTS

A delay locked loop (DLL) clock generator circuit is provided for generating a clock pulse based on a pair of input signals fed to the DLL circuit. One of the input signals is an external reference signal, and the other input signal is a time delayed feedback signal of a voltage controlled delay line circuit (VCDL). The DLL circuit includes a phase detector that detects a phase difference between the external reference signal and the feedback signal, and generates an output signal that is further processed by the DLL circuit to generate a number of delayed signals that are fed to a frequency multiplier. Using the delayed signals, the frequency multiplier generates a frequency multiplied clock signal based on the frequency of the reference signal.

Figure 1:
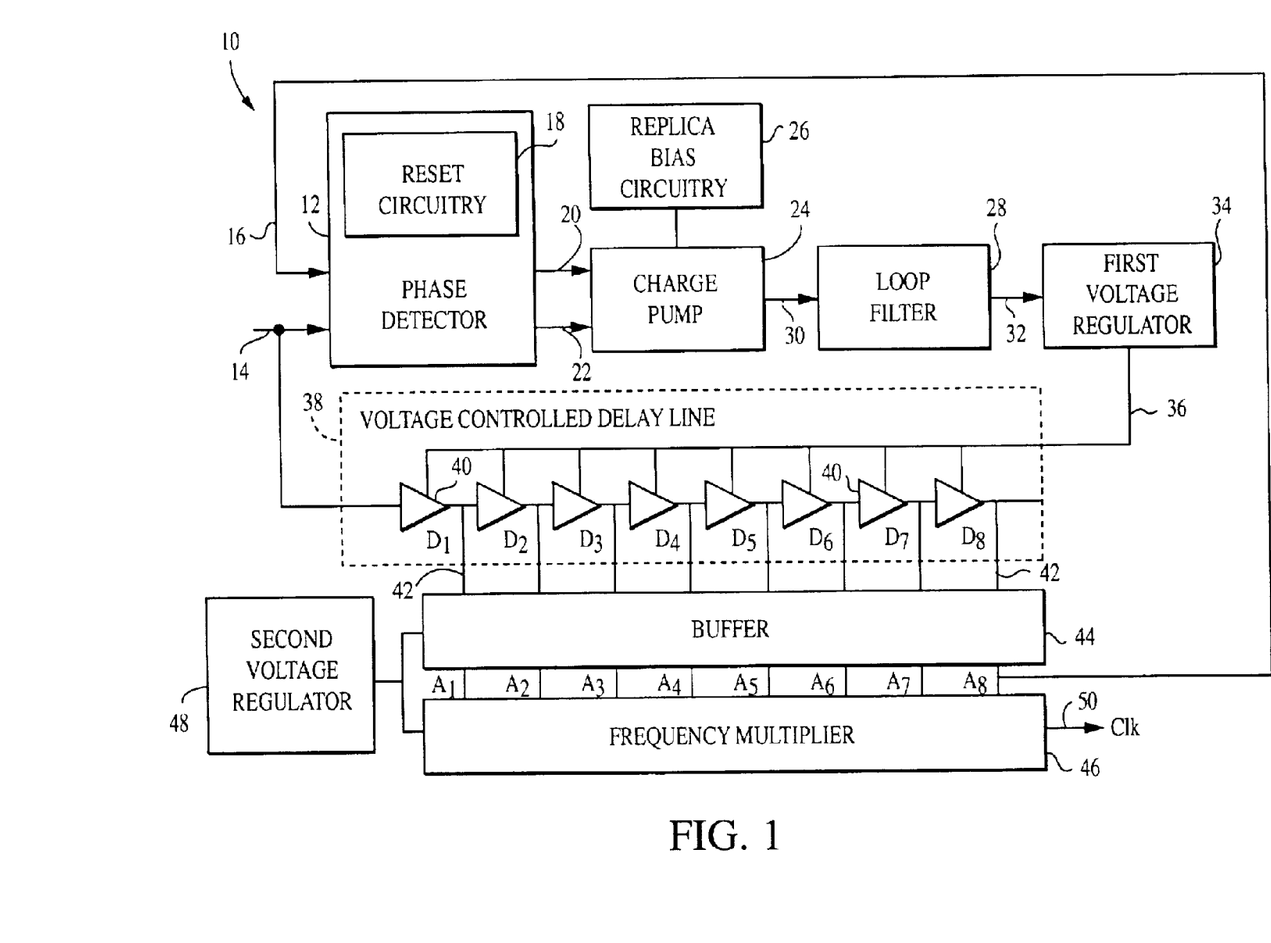
FIG. 1 illustrates a block diagram of a preferred embodiment for a DLL clock generator circuit.

FIG. 1 is a block diagram of a preferred embodiment DLL clock generator circuit 10. The DLL circuit 10 includes a phase detector 12 for detecting a phase difference between a reference signal 14 and a feedback signal 16. The phase detector 12 has reset circuitry 18 associated therewith to expand a locking range between the reference signal 14 and the feedback signal 16 for maintaining synchronization between the reference and feedback signals. In particular, the reset circuitry 18 is configured to charge or discharge one or more of a plurality of nodes (e.g., inputs and outputs of NAND gates) of the phase detector 12 to extend the phase delay locking range of the phase detector for aligning or synchronizing the delayed signals with the reference signal 14.

After receiving the reference signal 14 and feedback signal 16 inputs, the phase detector 12 generates phase detector output signals that are outputted as either an up (UP) signal 20 or a down (DN) signal 22 according to the phase difference between the reference signal 14 and the feedback signal 16. That is, the phase detector 12 produces output voltages that are proportional to the phase difference of the respective input reference signals 14 and feedback reference signals 16 concurrently inputted into the phase detector. Moreover, the UP signal 20 and/or the DN signal 22 can be transmitted from the phase detector 12 as a single signal or alternatively as multiple signals.

The UP signal 20 and/or DN signal 22 outputted from the phase detector 12 are inputted to a charge pump 24. The charge pump 24 provides voltage signals responsive to the UP/DN signals 20, 22 indicative of the phase difference between the phase detector input signals 14, 16. In addition to the phase detector 12, a replica bias circuit 26 preferably connects to the charge pump 24 and enables the charge pump to operate accurately at high switching speeds. A loop filter 28 filters an output signal 30 from the charge pump 24 to reduce jitter in the output signal, and provides a loop filter output signal 32 to a voltage regulator 34. The voltage regulator 34 further filters noise and jitter from the loop filter signal 32, and provides a control signal 36 that is voltage regulated to a VCDL 38. The reference signal 14 is also inputted into the VCDL 38.

In a preferred embodiment for frequency multiplication by four, the VCDL 38 has a number of delay cells ($D_1$–$D_8$) of serially connected inverter circuits 40 with a first delay cell $D_1$ receiving the reference signal 14. For example, the DLL clock generator 10 can be implemented in a 0.35 micrometer single-poly four metal process with a 3.3V voltage supply. In addition, the charge pump 24 is preferably designed to avoid UP/DN current mismatches to achieve minimum static phase error over the maximum VCDL control voltage range, and the first voltage regulator 34 is designed with a single-pole regulating amplifier for regulating the supply voltage without compromising noise rejection and the overall loop bandwidth. The VCDL 38 has delay cells ($D_1$–$D_8$) formed by inverter circuits 40 comprising two serially connected inverters. Delay of the VCDL 38 is accomplished by controlling the supply voltage provided by the voltage regulator 34 to the VCDL. The VCDL 38 provides delay cell output signals 42 from each of the inverter circuits 40 that are each phase delayed with respect to the control signals 36. The delay cell output signals 42 are then fed into a level-shifting buffer 44 that provides output signals (A1–$A_8$) that are level-shifted to CMOS levels and fed into a frequency multiplier 46. The buffer 44 additionally generates the feedback signal 16 to the phase detector 12 from the voltage controlled delay lines' final stage output ($A_8$). A second voltage regulator 48 connects and supplies power to the buffer 44 and the frequency multiplier 46 to minimize jitter of buffer output signals $A_1$–$A_8$, and a clock signal (Clk) 50 generated by the frequency multiplier. The frequency multiplier 46 generates Clk 50 in response to the rising edges of the buffer output signals ($A_1$–$A_8$). That is, the Clk 50 is toggled for each rising edge of the buffer output signals ($A_1$–$A_8$). An advantage of generating the Clk 50 in this manner is that even though the duty cycle ratio of the buffer output signals ($A_1$–$A_8$) is not 50%, the Clk toggles at an even time interval.

The Clk 50 has a multiplied frequency relative to the input reference signal 14, and can be used in various electronic devices such as a microprocessor, an audio or video appliance, memory, etc. By way of example, if the frequency of the reference signal 14 is 250 MHz, and the DLL circuit 10 is configured to have a frequency multiplication of four (i.e., the VCDL 38 having eight delay cells), then the frequency of the Clk 50 is four times the reference signal frequency or 1 GHz. In other embodiments, the number of delay cells ($D_1$–$D_8$) and outputs 42 from the VCDL 38 can be a number other than eight to provide a different frequency multiplication since the frequency of the Clk 50 is determined by multiplying the frequency of the reference signal 14 by the number of delay cells, and then dividing the result by two. The divide by two factor enables frequency multiplication that can be either an integer or a non-integer multiple of the reference signal frequency.

Figure 2:
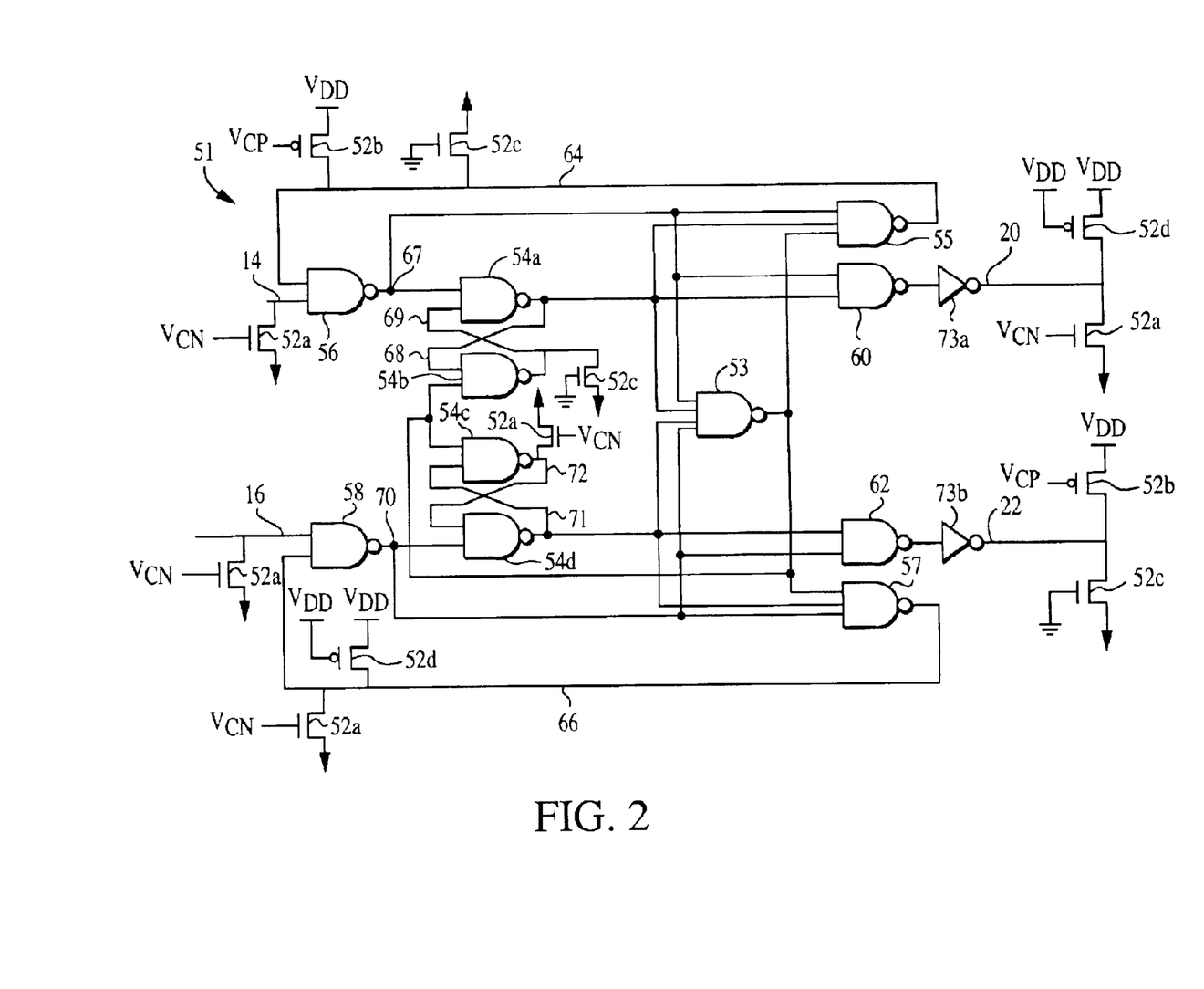
FIG. 2 illustrates a circuit schematic of a phase detector having precharged nodes for the DLL clock generator of FIG. 1.
Figure 3A:
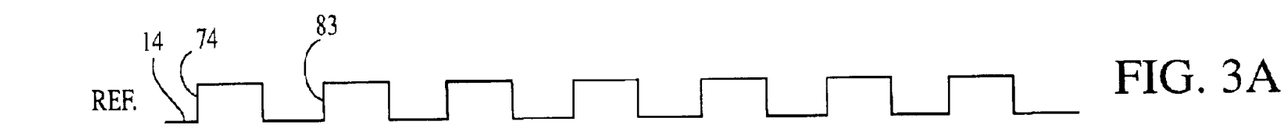
FIGS. 3A–3D are diagrams illustrating signal waveforms during the locking process of the phase detector of FIG. 1.
Figure 3B:
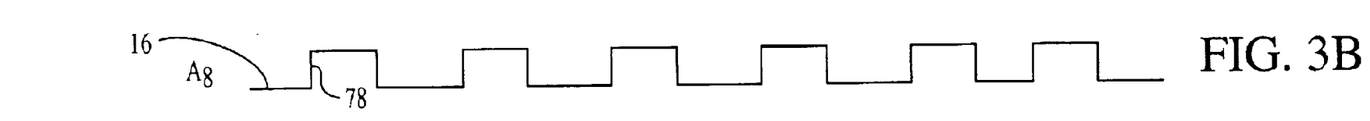
Figure 3C:
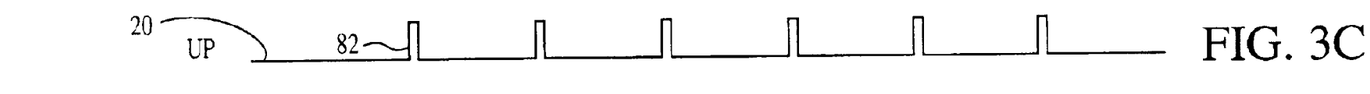
Figure 3D:
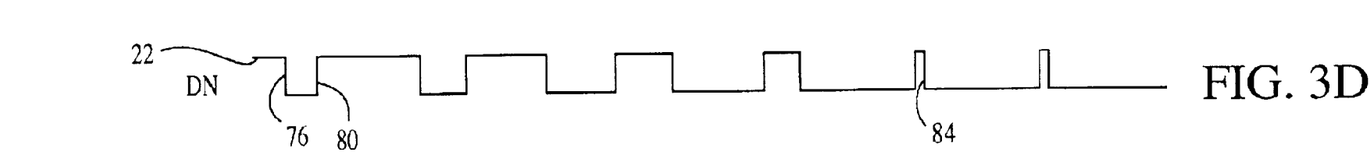

Referring now to FIG. 2, a preferred embodiment of the phase detector 12 and reset circuitry 18 are shown with a symmetrical circuit design structure 51 to minimize static phase error. In the preferred embodiment, an external reference signal 14 and a feedback signal 16 are inputted to the circuit 51. In particular, the circuit 51 includes five NMOS transistors 52a and two PMOS transistors 52b to reset nodes. Additionally, the circuit 51 has three NMOS transistors 52c and two PMOS transistors 52d to minimize static phase offset. The circuit 51 also has a plurality of interconnected NAND gates that include an internal NAND gate 53, a NAND gate pair 54a, 54b, a second NAND gate pair 54c, 54d, a feedback NAND gate 55, and an input NAND gate 56. The plurality of interconnected NAND gates further include a second feedback NAND gate 57, a second input NAND gate 58, and output NAND gates 60, 62.

A node 64 connects an input of gate 56 to an output of gate 55, which provides a first internal feedback signal to gate 56. The gate 56 also receives as an input the reference signal 14. Similarly, a node 66 connects an input of gate 58 to an output of gate 57 which provides a second internal feedback signal to gate 58. The gate 58 also receives the feedback signal 16 as an input. The NAND gate pair 54a and 54b are connected to an output 67 of gate 56. A node 68 feeds, among other things, the output of gate 54a to an input of gate 54b. Another node 69 feeds the output gate 54b to an input of gate 54a enabling gates 54a and 54b to have outputs feeding each other. In a similar manner, gates 54c and 54d are connected to an output 70 of gate 58. A node 71 feeds, among other things, the output of gate 54d to an input of gate 54c. Another node 72 feeds the output of gate 54c to an input of gate 54d enabling gates 54c and 54d to have outputs feeding each other. In addition to the plurality of interconnected NAND gates 54, the circuit 51 further includes an inverter 73a that generates as an output the UP signal 20, and a second inverter 73b that generates as an output the DN signal 22.

In operation, the circuit 51 has nodes at the reference signal 14, feedback signal 16, the outputs of the inverters 73a, 73b, as well as internal nodes 64, 66, and 72 that are charged or discharged by their respective NMOS transistors 52a or PMOS transistors 52b to either a high voltage or a low voltage prior to the inputting of the reference signal 14 and the feedback signal 16 to the input NAND gates 56, 58. Preferably, the nodes for inputting the input reference signal 14 and feedback signal 16, the output node 20 of the inverter 73a, the node 66, and the node 72 are discharged to a low voltage by the NMOS transistors 53a. In addition, preferably the output node 22 of the inverter 73b and the node 64 are charged to a high voltage by the PMOS transistors 53b. High voltage and low voltage as discussed herein indicate a voltage level of nodes in the circuit. In one embodiment, a high voltage can be defined as VDD volts and a low voltage defined as zero volts. However, it is understood that alternative voltage selections defining the low and high voltages can be implemented as is known to those skilled in the art.

To discharge the nodes 14, 16, 20, 66, and 72, a control signal $V_{CN}$ is provided at respective gates of the NMOS transistors 52a. Similarly, in order to charge the nodes 22, 64, a control signal VCP is provided at respective gates of the PMOS transistors 52b. The respective drains of the NMOS and PMOS transistors 52a and 52b are connected to the phase detector nodes that are charged or discharged. Moreover, in order to maintain symmetry in the circuit 51 and to reduce static phase offset, drains of the NMOS transistors 52c are connected to nodes 22, 64, 69, and their respective gates are preferably grounded. Also, the drains of PMOS transistors 52d are connected to nodes 20, 66, and the respective gates of the transistors are preferably connected to a high voltage, such as $V_{DD}$.

FIGS. 3A–D illustrate the locking process of the phase detector 12 of FIGS. 1 and 2 having charged or discharged nodes (i.e., inputs and/or outputs of one or more of the plurality of NAND gates of the phase detector and outputs 20, 22 of the phase detector) prior to receiving a reference signal 14 and a feedback signal 16. In order to have correct locking between the reference signal 14 and the delayed feedback signal 16 without charging or discharging of the phase detector's nodes, the delay of the delay line signal 16 should be in the following locking range:

$$T_{Ref}/2 < VCDL_{delay} < 3T_{Ref}/2, \qquad (1)$$

where $T_{Ref}$ and $VCDL_{delay}$ represent the period of the reference signal 14 and the delay of the delay line $A_8$, respectively. That is, for correct locking $VCDL_{delay}$ should be equal to $T_{Ref}$. If the delay of the delay line $A_8$ deviates from the above locking range, the DLL clock generator 10 may be stuck or locked in an incorrect harmonic delay. Charging and discharging nodes of the phase detector 12 prior to the phase detector receiving the reference signal 14 and the feedback signal 16 changes the locking range of Eqn. 1. In particular, the locking range is expanded beyond the $T_{ref}/2$ lower phase limit.

Referring again to FIGS. 3A–D, the node of the DN output signal 22 is charged to a high voltage before the input reference signal 14 is inputted into the phase detector 12. The rising edge 74 of a first pulse of the input reference signal 14 triggers the DN signal 22 to go to a low voltage state at 76. The phase detector 12 can now compare the phase difference between the feedback signal ($A_8$) and the input reference signal 14 with the 2π phase offset once the phase of the feedback signal 16 is within a 3π range. This ensures that the lower boundary of limited locking range for the DLL clock generator 10 is eliminated enabling the VCDL output 42 to be initialized with a broader range. This broader range is advantageous as compared to other phase detectors whose locking range output for synchronization of the reference signal 14 and feedback signal 16 is narrower.

An example of the broader range locking range output is illustrated in FIGS. 3A–D. When the feedback signal 16 goes to a high voltage 78, the DN signal 22 goes to a high voltage 80. Furthermore, when the UP signal 20 goes to a high voltage 82, the input reference signal 14 goes to a high voltage 83. Once the UP and DN signals 20, 22 respectively are in a high voltage they remain at the high voltage for a short time and then return to a low voltage. The UP signal 20 increases the control voltage of the VCDL 38 and causes the VCDL outputs 42 to have smaller delays until the DLL clock generator circuit 10 is locked at pulse 84. Once locked, the phase detector 12 generates only short pulses to prevent a dead zone of the phase detector. Further, the control voltage of the VCDL 38 is initialized to ensure that the VCDL delay is within the locking range, and can be initialized within an expanded range due to the expanded locking range. That is, if the phase detector is reset by charging/discharging the phase detector's outputs and/or inputs to gates of the phase detector prior to receiving the reference signal 14 and the feedback signal 16, then the locking range is expanded. Moreover, the phase difference has an upper limit only, and can be extended to a phase delay of 3π or less between the reference signal and the feedback signal.

Figure 4:
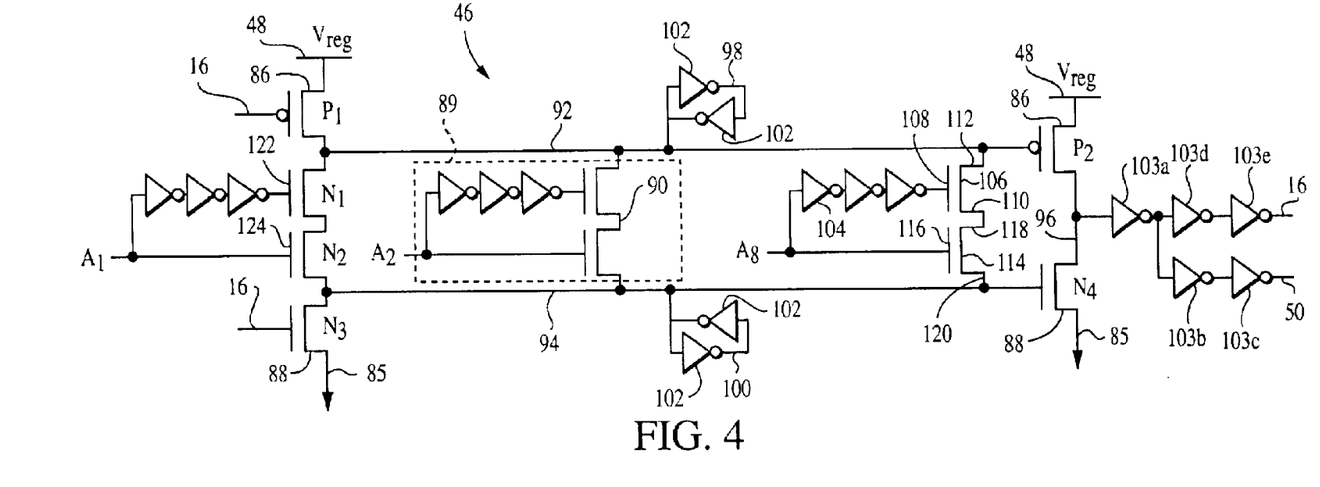
FIG. 4 illustrates a circuit schematic of a frequency multiplier for the DLL clock generator of FIG. 1.

FIG. 4 illustrates a circuit schematic of a preferred embodiment frequency multiplier 46 for the DLL clock generator circuit 10 of FIG. 1. A regulated power supply signal, $V_{reg}$ is provided by the second voltage regulator 48 to supply power for the frequency multiplier 46 which is connected to a low voltage, e.g., ground, at nodes 85. The frequency multiplier 46 includes a plurality of PMOS transistors 86 ($P_1$–$P_2$) and a plurality of NMOS transistors 88 ($N_1$–$N_4$) matched and joined as a plurality of separate gate inputs configured to receive the buffer output signals ($A_1$–$A_8$) of FIG. 1. The feeding of the buffer output signals to the frequency multiplier 46 is illustrated by the subcircuit 89 receiving the $A_2$ buffer output signal. The $A_2$ buffer output signal is fed into cascaded transistor pairs, such as cascaded transistor pair 90, which define frequency multiplier nodes 92, 94. The feeding of the $A_1$ and $A_8$ buffer output signals are also illustrated in FIG. 4. In a similar manner to the subcircuit 89, the $A_3$–$A_7$ buffer output signals (not shown) are connected to the frequency multiplier nodes 92, 94.

The nodes 92, 94 are charged to a high or low voltage according to the buffer output signals ($A_1$–$A_8$). Preferably, a latch 98 connects to node 92 and a second latch 100 connects to node 94. Each of the latches 98, 100 includes a pair of inverters 102 connected in series. The frequency multiplier 46 is configured to generate two outputs. One output is the Clk 50 from the final stage output of inverters 103a, 103b, and 103c, which are connected in series. The second output is the feedback signal 16 from the final stage output of inverters 103a, 103d, and 103e, which are also connected in series.

In one embodiment, the plurality of separate gate inputs fed by the buffer outputs ($A_1$–$A_8$) each comprise one or more gate input inverters 104 connected in series and configured to receive a single buffer output signal (e.g., $A_8$). The gate inputs further include a transistor 106 having a gate 108 connected to the one or more inverters 104, a source 110, and a drain 112 connected to the node 92. Further included is a second transistor 114 that has a gate 1 16 configured to receive the final buffer output signal ($A_8$). The transistor 114 also has a drain 118 connected to the source 110 of transistor 106, and a source 120 connected to node 94. For the buffer output signal $A_1$, a delayed version of the signal $A_{1db}$ is fed to the gate 122 of the $N_1$, transistor, and the $A_1$ signal is fed to the gate 124 of the $N_2$ transistor to turn on and turn off the $N_1$, and $N_2$ transistors, which charges and discharges the nodes 92, 94 of FIG. 4. More particularly, the $A_1$ and $A_{1db}$ signals mimic generation of a virtual pulse clock signal $PC_1$.

Figure 5A:
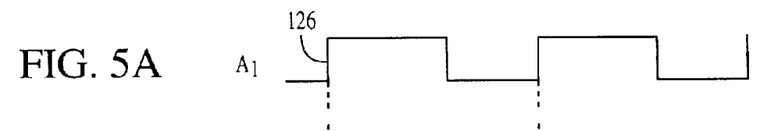
FIGS. 5A–5C provide an illustration of the $A_1$ buffer input and the delayed $A_{1b}$ buffer input which mimic a virtual pulse clock signal $PC_1$, fed to the frequency multiplier of the DLL clock generator of FIG. 1.
Figure 5B:
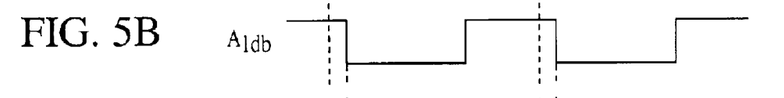
Figure 5C:
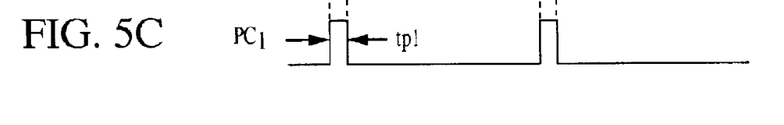
Figure 6A:
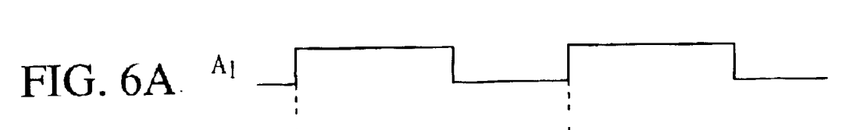
FIGS. 6A–6I are diagrams illustrating signal waveforms for one embodiment of a DLL circuit generating a clock pulse having a frequency multiplication of two.
Figure 6B:
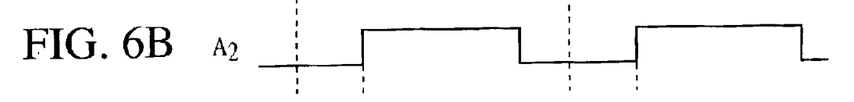
Figure 6C:
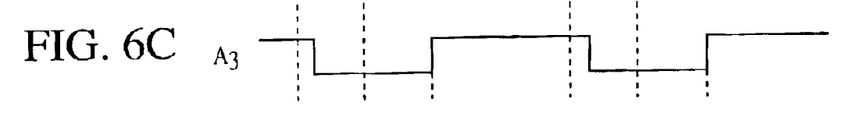
Figure 6D:
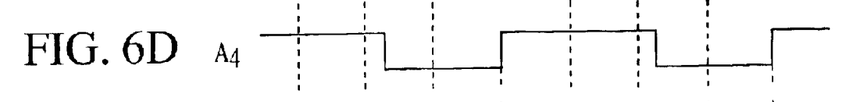
Figure 6E:
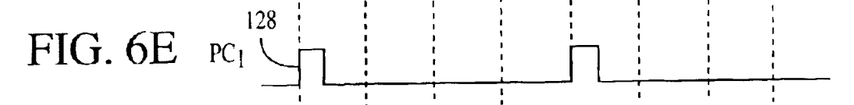
Figure 6F:
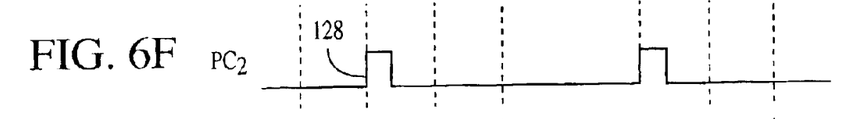
Figure 6G:
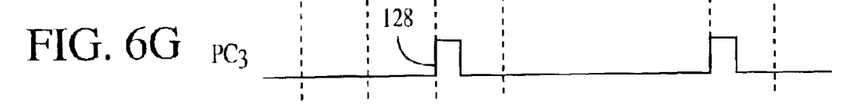
Figure 6H:
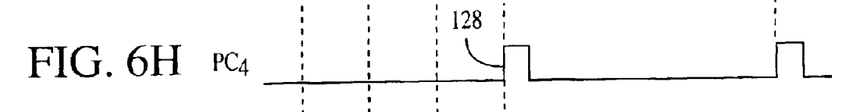
Figure 6I:
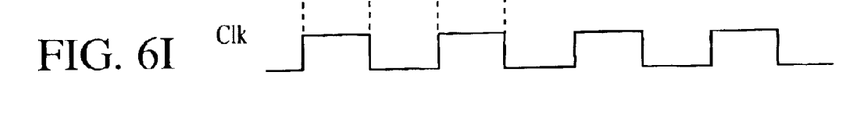

FIGS. 5A–C provide an illustration of the virtual pulse clock signal $PC_1$, due to the $A_1$ and $A_{1db}$ inputs to the frequency multiplier 46. In operation, when the feedback signal 16 is at a high voltage, the node 94 of the frequency multiplier 46 of FIG. 4 is discharged to a low voltage through NMOS transistor $N_3$, and the node 92 remains at a high voltage. At a rising edge 126 of the $A_1$ signal, the delayed signal $A_{1db}$ is at a high voltage and transistors $N_1$, and $N_2$ are both turned on for a short time duration of tp1 and transfer data between the nodes 92 and 94. If the node 92 is discharged to a low voltage through transistors $N_1$, $N_2$, and $N_3$ after the $A_1$ signal rises to a high voltage, transistor $P_2$ charges output node 96 to a high voltage. After passing through the three serially connected inverters 103a, 103d, and 103e, the feedback signal 16 is at a low voltage and the node 92 is charged to a high voltage by transistor $P_1$. The node 94 remains in a low voltage state. At a rising edge (not shown) of the $A_2$ signal inputted to the frequency multiplier 46, the data transfer from the node 92 to the node 94 occurs in a similar manner. After data transfer is completed, the node 94 drives transistor $N_4$ to discharge the node 96 to a low voltage resulting in the Clk 50 of FIG. 1 toggling between a high voltage and a low voltage at the rising edge of each delayed buffer output signal ($A_1$–$A_8$).

FIGS. 6A–I provide an illustration of a generated clock pulse Clk using a frequency multiplier having four buffer output signals ($A_1$–$A_4$) resulting in a frequency multiplication of two. In this illustration, the signals ($A_1$–$A_4$) and associated delayed signals ($A_{1db}$–$A_{4db}$) (not shown) mimic four virtual pulse clock signals ($PC_1$–$PC_4$). While the duty cycle ratio of the input signals ($A_1$–$A_4$) is not 50%, the time intervals indicated by the rising edges 128 of the virtual pulse clock signals ($PC_1$–$PC_4$) identify the even time interval toggling of the DLL generated clock signal Clk. Moreover, the frequency of the Clk can be controlled by the number of buffer output signals fed to the frequency multiplier as well as the frequency of the reference signal 14 inputted to the phase detector 12 of FIG. 1.

In a preferred embodiment, a method is provided for multiplying a frequency of a reference signal inputted into a delayed locked loop clock generator. The method includes the step of resetting a phase detector of the delayed locked loop clock generator to expand a locking range of the phase detector. Next, the method inputs the reference signal and a feedback signal to the reset phase detector to generate a control signal. The method also includes the steps of separating the control signal into one or more delayed signals, and then generating a clock signal toggled at an edge of each of the one or more delayed signals. At least one of the one or more delayed signals can be the feedback signal, and is preferably the final stage delayed signal.

Preferably, the expansion of the locking range allows a $3\pi$ phase delay between the reference signal and the feedback signal with an upper phase delay limit of $3\pi$. In other expanding locking range schemes, the locking range includes an unlimited lower phase limit. Expansion of the locking range occurs due to resetting of the phase detector. Resetting occurs by charging or discharging inputs to gates of the phase detector, and also in one embodiment outputs of the phase detector. In other embodiments, the control signal can be filtered prior to separating the control signal, and/or the one or more delay signals can be buffered prior to generating the clock signal.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for multiplying a frequency of a reference signal inputted into a delayed locked loop clock generator, the method comprising the steps of:

resetting a phase detector of the delayed locked loop clock generator by presetting at least one output gate voltage of an output gate of the phase detector to enable a feedback signal to be inputted into the phase detector with a phase delay relative to the reference signal and remain synchronized with the reference signal;

generating a control signal in response to the phase delay;

separating the control signal into one or more delayed signals; and generating a clock signal toggled at an edge of each of the one or more delayed signals.

2. The method of claim 1, wherein the phase delay is $3\pi$ or less between the reference signal and the feedback signal.

3. The method of claim 1, wherein the phase delay between the reference signal and the feedback signal has an upper phase delay limit of $3\pi$ and a lower phase delay limit less than $3\pi$.

4. The method of claim 3, wherein the lower phase delay limit between the reference signal and the feedback signal is eliminated.

5. The method of claim 1, wherein resetting of the phase detector includes the step of one of charging and discharging inputs to NAND gates of the phase detector.

6. The method of claim 5, wherein resetting of the phase detector further includes the step of one of charging and discharging outputs of the phase detector.

7. The method of claim 1, further comprising the step of buffering the one or more delayed signals prior to generating the clock signal.

8. The method of claim 1, further comprising the step of filtering the control signal prior to separating the control signal.

9. The method of claim 8, wherein the feedback signal comprises one of the one or more delayed signals.

10. The method of claim 1, wherein the one or more delayed signals have a duty cycle ratio other than 50%.

11. A delayed locked loop clock generator circuit comprising:

a voltage controlled delay line receiving as an input a reference signal;

a frequency multiplier receiving delayed output signals from the voltage controlled delay line to generate a clock signal having a multiplied frequency relative to a frequency of the reference signal; and a phase detector having a plurality of output gates and receiving the reference signal and a delayed feedback signal to produce a control signal proportional to a phase delay of $3\pi$ or less between the delayed feedback signal of the voltage controlled delay line and the reference signal, the control signal provided as a controlled voltage to the voltage controlled delay line, and wherein the phase detector is reset by presetting at least one output gate voltage of the output gates.

12. The delayed locked loop clock generator of claim 11, the phase delay between the delayed feedback signal and the reference signal has an upper phase delay limit only.

13. The delayed locked loop clock generator of claim 12, wherein one of the delayed output signals is the delayed feedback signal.

14. The delayed locked loop clock generator of claim 13, wherein the phase detector is reset prior to receiving the reference signal and the delayed feedback signal.

15. The delayed locked loop clock generator of claim 14, wherein resetting of the phase detector comprises one of charging and discharging inputs to gates of the phase detector.

16. The delayed locked loop clock generator of claim 15, wherein the resetting of the phase detector further comprises one of charging and discharging outputs of the phase detector.

17. The delay locked loop clock generator of claim 11, wherein the frequency multiplier toggles the frequency multiplied clock signal between one of a low voltage and a high voltage for each rising edge of the delayed output signals of the voltage controlled delay line.

18. The delayed locked loop clock generator circuit of claim 11, wherein the delayed output signals have a duty cycle ratio other than 50%.

19. A delayed locked loop clock generator comprising:
- a voltage controlled delay line receiving a control signal to generate a plurality of delayed output signals;
- a phase detector having at least one output of an output gates reset prior to accepting a feedback signal from the voltage controlled delay line and a reference signal, the phase detector producing the control signal according to a phase delay between the feedback signal and the reference signal; and
- a frequency multiplier responsive to the reference signal and an edge of each of the plurality of delayed output signals, the frequency multiplier generating a clock signal toggled between the low voltage and the high voltage at each edge of the plurality of delayed output signals.

20. The delayed locked loop clock generator of claim 19, wherein the phase delay is $3\pi$ or less between the reference signal and the feedback signal.

21. The delayed locked loop clock generator of claim 20, wherein the phase detector has one or more of a plurality of NAND gates having inputs and outputs that are one of charged and discharged prior to the phase detector receiving the reference signal and the feedback signal.

22. The delayed locked loop clock generator of claim 19, wherein a rising edge of each of the plurality of delayed output signals toggles the clock signal.

23. The delayed locked loop clock generator of claim 19, wherein the plurality of delayed output signals have a duty cycle ratio other than 50%.

* * * * *

UNITED STATES PATENT AND TRADEMARK OFFICE
CERTIFICATE OF CORRECTION

PATENT NO. : 6,784,707 B2
DATED : August 31, 2004
INVENTOR(S) : Kim et al.

It is certified that error appears in the above-identified patent and that said Letters Patent is hereby corrected as shown below:

Column 5,
Line 4, delete "VCP" and insert -- Vcp -- therefore

Column 6,
Line 47, delete "1 16" and insert -- 116 -- therefore

Column 8,
Line 51, after "claim 11" insert -- wherein -- therefore
Line 54, delete "12" and insert -- 11 -- therefore Column 9,
Line 13, delete "gate" and insert -- gates -- therefore Signed and Sealed this Fifth Day of April, 2005

JON W. DUDAS
*Director of the United States Patent and Trademark Office*